United States Patent
Aritome

(10) Patent No.: US 8,462,548 B2
(45) Date of Patent: *Jun. 11, 2013

(54) NON-VOLATILE MEMORY DEVICE CAPABLE OF REDUCING FLOATING GATE-TO-FLOATING GATE COUPLING EFFECT DURING PROGRAMMING

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

This patent is subject to a terminal disclaimer.

(21) Appl. No.: 13/116,861

(22) Filed: May 26, 2011

(65) Prior Publication Data

US 2011/0222352 A1    Sep. 15, 2011

Related U.S. Application Data

(63) Continuation of application No. 11/448,063, filed on Jun. 6, 2006, now Pat. No. 7,952,922.

(51) Int. Cl.
*G11C 16/04* (2006.01)

(52) U.S. Cl.
USPC ............ 365/185.02; 365/185.24; 365/185.03; 365/185.12; 365/185.11; 365/185.17; 365/185.22

(58) Field of Classification Search
USPC ............ 365/185.03, 185.02, 185.12, 185.11, 365/185.17, 185.22, 185.24
See application file for complete search history.

(56) References Cited

U.S. PATENT DOCUMENTS

| | | | |
|---|---|---|---|
| 5,712,969 A | 1/1998 | Zimmermann et al. | |
| 5,732,018 A | 3/1998 | Choi et al. | |
| 5,915,080 A | 6/1999 | Park | |
| 6,400,604 B2 | 6/2002 | Noda | |
| 7,257,032 B2 | 8/2007 | Fujiu et al. | |
| 7,349,249 B2 * | 3/2008 | Honma et al. | 365/185.03 |
| 7,391,651 B2 | 6/2008 | Chen | |
| 7,453,735 B2 | 11/2008 | Li et al. | |
| 7,701,765 B2 * | 4/2010 | Aritome | 365/185.12 |
| 7,952,922 B2 * | 5/2011 | Aritome | 365/185.02 |
| 2001/0017789 A1 | 8/2001 | Noda | |
| 2007/0147127 A1 | 6/2007 | Lin et al. | |
| 2008/0158951 A1 | 7/2008 | Aritome | |

* cited by examiner

*Primary Examiner* — Andrew Q Tran
(74) *Attorney, Agent, or Firm* — Leffert Jay & Polglaze, P.A.

(57) ABSTRACT

A method for programming a non-volatile memory array comprising a plurality of memory cells. Each cell is adapted to store a lower and an upper page of data. The method: programs the lower page of predetermined memory cells with first predetermined data and the upper page with second predetermined data. One of the lower page or the upper page of the predetermined memory cells is reprogrammed with the first or second predetermined data, respectively.

16 Claims, 8 Drawing Sheets

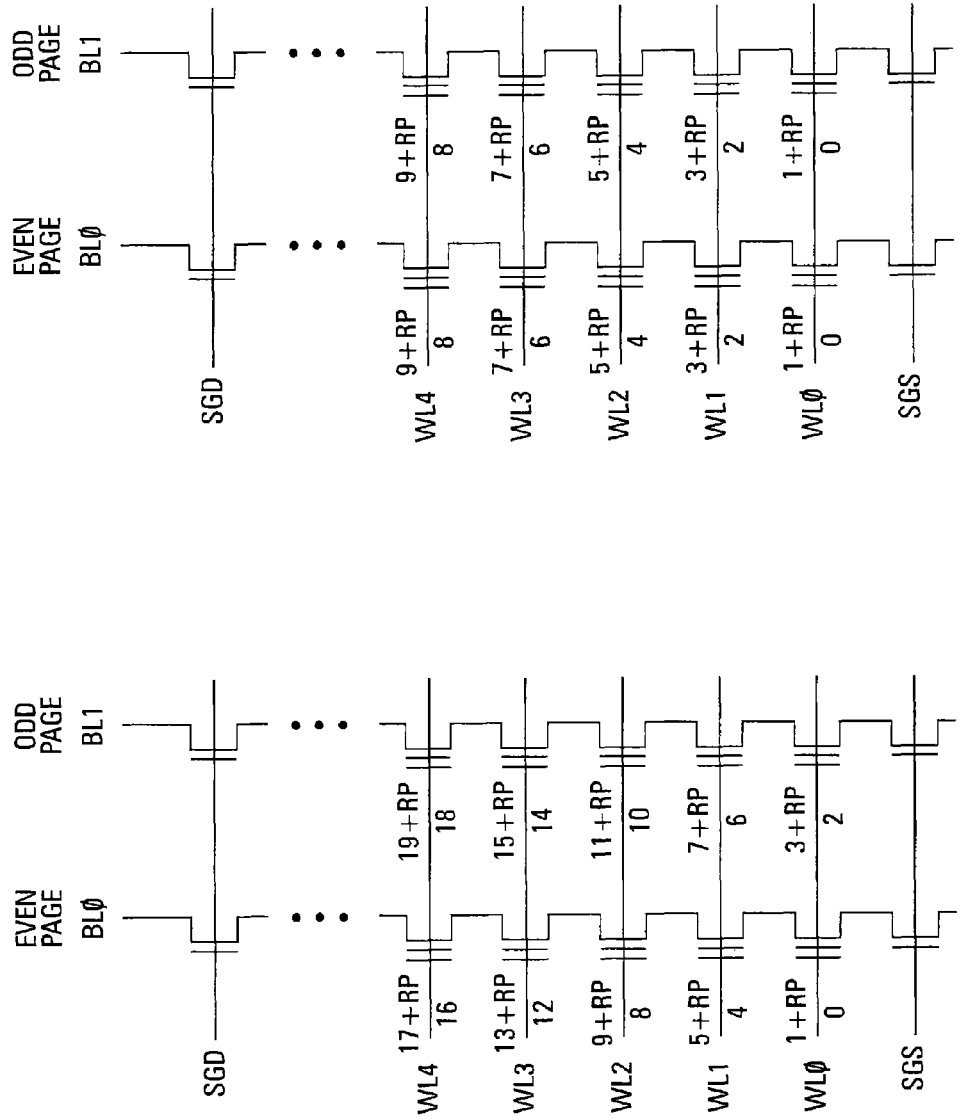

US 8,462,548 B2

NON-VOLATILE MEMORY DEVICE CAPABLE OF REDUCING FLOATING GATE-TO-FLOATING GATE COUPLING EFFECT DURING PROGRAMMING

RELATED APPLICATION

This application is a continuation of U.S. application Ser. No. 11/448,063, titled "PROGRAMMING A NON-VOLATILE MEMORY DEVICE" filed Jun. 6, 2006 now U.S. Pat. No. 7,952,922, which is commonly assigned and incorporated herein by reference.

TECHNICAL FIELD

The present invention relates generally to memory devices and in particular the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

FIG. 1 illustrates a simplified diagram of a typical prior art NAND flash memory array. The memory array of FIG. 1, for purposes of clarity, does not show all of the elements typically required in a memory array. For example, only two bit lines are shown (BL0 and BL1) when the number of bit lines required actually depends upon the memory density.

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines BL0, BL1 are eventually coupled to sense amplifiers (not shown) that detect the state of each cell.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL0, BL1) by a drain select gate 112, 113. The source select gates 116, 117 are controlled by a source select gate control line SG(S) 118 coupled to their control gates. The drain select gates 112, 113 are controlled by a drain select gate control line SG(D) 114.

A selected word line 100 for the flash memory cells 130-131 being programmed is typically biased by programming pulses that start at a voltage of around 16V and may incrementally increase to more than 20V. The unselected word lines for the remaining cells are typically biased at $V_{pass}$. This is typically in an approximate range of 9-10V. The bit lines of the cells to be programmed are typically biased at 0V while the inhibited bit lines are typically biased at $V_{CC}$.

As NAND flash memory is scaled, parasitic capacitance coupling between adjacent memory cell floating gates becomes a problem. Floating gate-to-floating gate interference can cause a wider $V_t$ distribution when the distribution is needed to be tighter. The wider distributions can result in degraded programming performance as well as other problems.

These problems for single level cell (SLC) NAND arrays are even worse in a multiple level cell (MLC) array. MLC memory stores multiple bits on each cell by using different threshold levels for each state that is stored. The difference between adjacent threshold voltage distributions is typically very small as compared to an SLC memory device. Therefore, the effects of the floating gate—to—floating gate coupling in an MLC device are greatly increased.

For the reasons stated above, and for other reasons stated below which will become apparent to those skilled in the art upon reading and understanding the present specification, there is a need in the art for a way to minimize the effects of floating gate-to-floating gate coupling in a memory device.

BRIEF DESCRIPTION OF THE DRAWINGS

FIG. 9 shows a portion of a non-volatile memory array including another alternate embodiment of a programming sequence of the present invention.

FIG. 10 shows a portion of a non-volatile memory array including another alternate embodiment of a programming sequence of the present invention.

DETAILED DESCRIPTION

Figure 1:
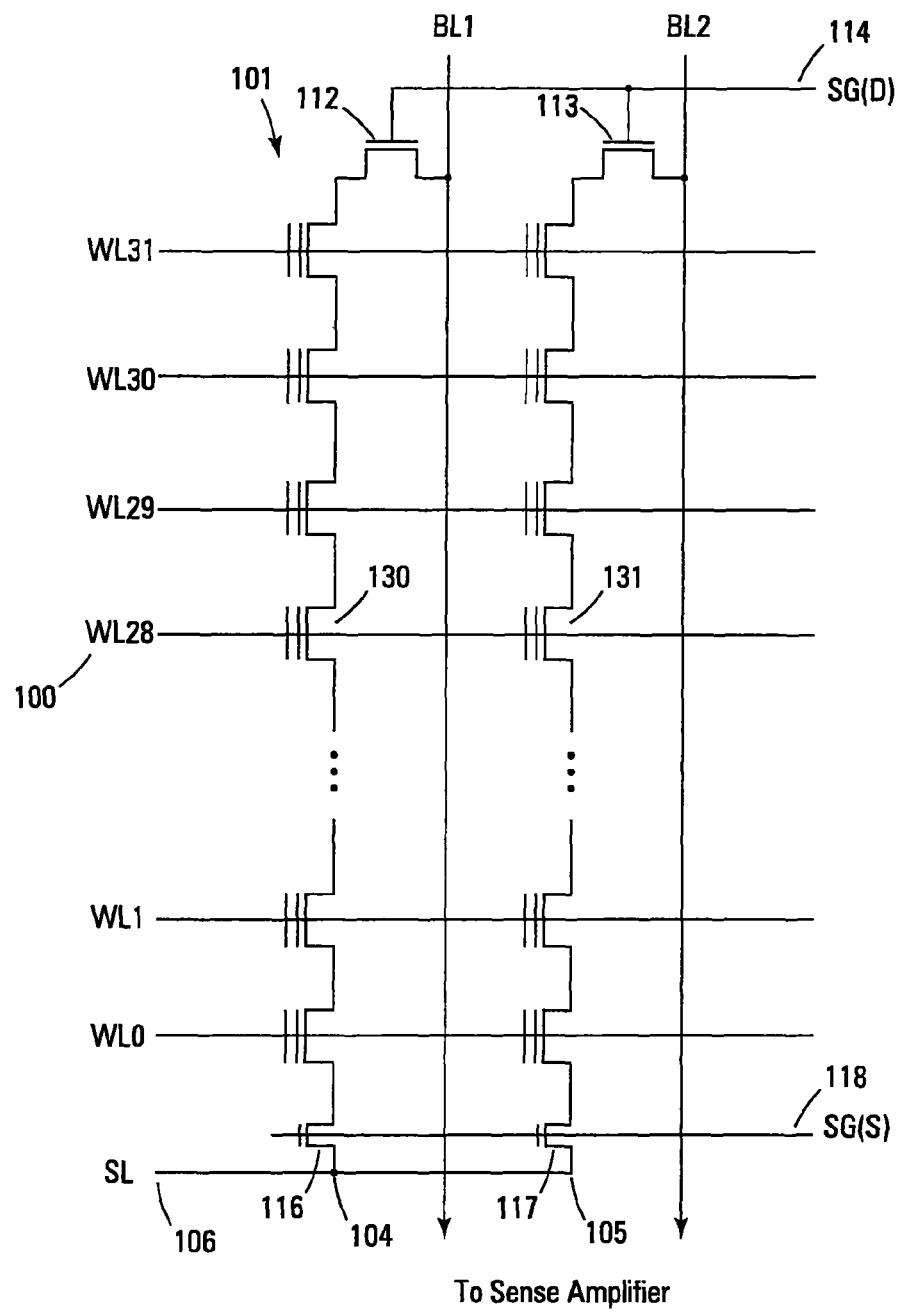
FIG. 1 shows a portion of a typical prior art NAND architecture flash memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
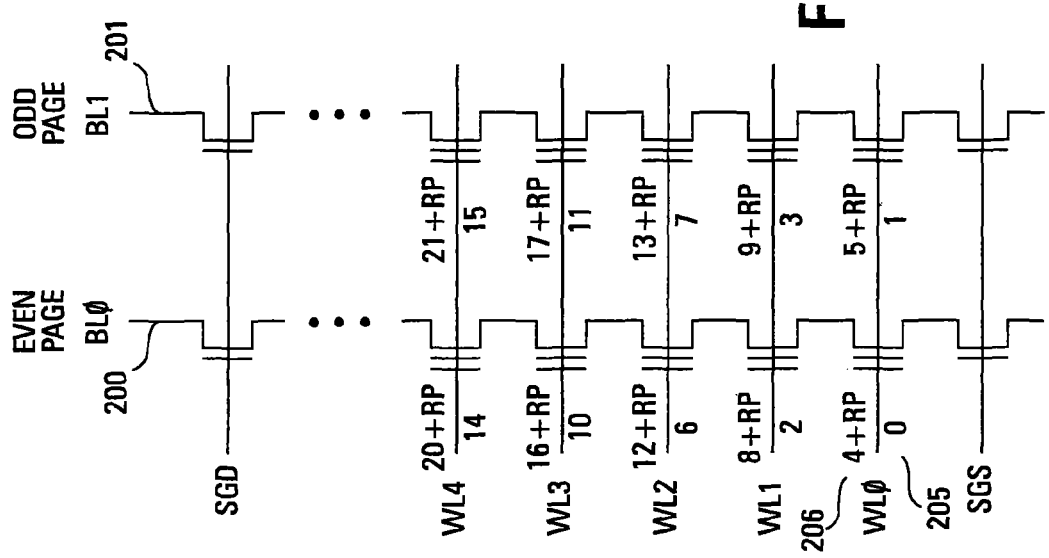
FIG. 2 shows a portion of a non-volatile memory array including one embodiment of a programming sequence of the present invention.

FIG. 2 illustrates a schematic diagram of a portion of a non-volatile memory array showing one embodiment of the programming sequence of the present invention. The array illustrated may be a portion of a memory block that includes a bit line 200 with an even page of data and a bit line 201 with an odd page of data.

In one embodiment, programming is started from the bottom of the array that is closest to the source line of the block. In the illustrated array, the closest word line is WL0. Programming proceeds generally upward from WL0 (i.e., WL0, WL1, WL2, WL3 . . . ). The memory cells of the embodiment of FIG. 2 are multilevel cells (MLC) that each store two data bits.

Each memory cell shows the programming order of each data bit. The lower number 205 on each cell is the lower page of programmed data. The upper number 206 on each cell is the upper page of programmed data.

The programming sequence of the embodiment of FIG. 2 is page 0, page 1, page 2, page 3, page 4, page 5, page 6, page 7, page 8, page 9, reprogram page 4, reprogram page 5, page 10, page 11, page 12, page 13, reprogram page 8, reprogram page 9. This sequence repeats for the entire memory block being programmed.

FIG. 2 shows that the lower page of WL0 is programmed first (page 0 and 1). Next, the lower page of WL1 is programmed (i.e., page 2 and 3). The upper page of WL0 is then programmed (i.e., page 4 and 5) followed by the lower page of WL2 (i.e., page 6 and 7). The upper page of WL1 is then programmed (i.e., page 8 and 9).

Next, programming returns to the upper page of WL0. This step reprograms the same data into page 4 and page 5 in order to tighten the distributions of the states of their respective cells. The reprogramming of pages 4 and 5 is shown in FIG. 2 as page 4+RP and page 5+RP. This nomenclature is used throughout FIG. 2 as well as subsequent embodiments to show that the page is initially programmed (i.e., page 4 and page 5) then "reprogrammed" with the same data (i.e., +RP) to tighten the $V_t$ distribution.

The reprogramming of the upper pages of the memory cells is performed using a program/verify operation. The selected word line is biased with a series of programming pulses with a verify operation between each pulse. During this reprogramming operation, the cell is verified to a slightly higher voltage than when it was initially programmed. In one embodiment, the new verify voltage is in a range of 100-200 mV greater than the original verification operation.

Figure 3:
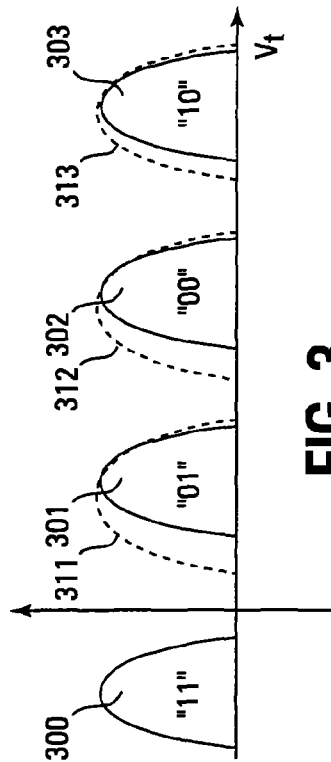
FIG. 3 shows a diagram of the threshold voltage distributions in accordance with the programming sequence of FIG. 2.

FIG. 3 illustrates a diagram of the $V_t$ distributions in accordance with the embodiment of FIG. 2. The dotted lines 311-313 of each programmed state illustrate the $V_t$ distributions prior to the "reprogramming" operations of the present invention. The solid lines show the threshold voltages for each programmed state 301-303 as they would be after a normal program/verify operation but prior to being "reprogrammed". In this embodiment, the states are a logical "11" 300 for an erased state, a logical "01" 301 for the next state, a logical "00" 302 for the next state, and a logical "10" 303 for the final state. Alternate embodiments can use a different order for the programmed states.

FIG. 3 shows that the threshold voltage distributions, after the upper pages have been reprogrammed, are smaller. This shows that the upper page reprogramming of the present invention minimizes the floating gate-to-floating gate coupling effects to provide less interference between states.

Figure 4:
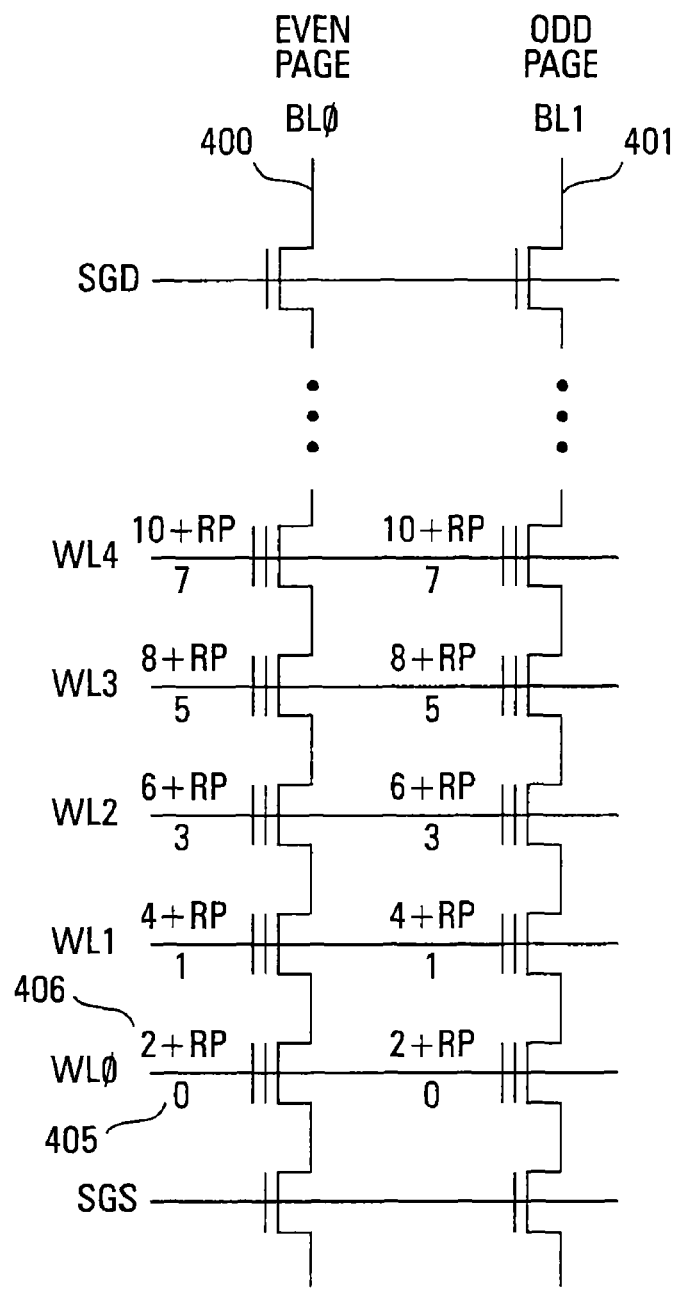
FIG. 4 shows a portion of a non-volatile memory array including an alternate embodiment of a programming sequence of the present invention.

FIG. 4 illustrates a schematic diagram of a portion of a non-volatile memory array that uses an alternate embodiment of the upper page reprogramming method of the present invention. As in the embodiment of FIG. 2, this figure shows the even page bit line 400 and the odd page bit line 401. The numbers accompanying each cell indicates the programming order of the pages of data of the cell. The lower number 405 of each cell is the lower page of data and the upper number 406 indicates the upper data page.

The embodiment of FIG. 4 programs the odd and even pages substantially simultaneously. In other words, WL0 is biased for programming the lower page of data (i.e., page 0) on both BL0 and BL1. Next WL1 is biased for programming the lower page of data (i.e., page 1) on both BL0 and BL1. The upper page of WL0 is then programmed (i.e., page 2) on both BL0 and BL1. The lower page of WL2 (i.e., page 3) is then programmed on both BL0 and BL1. Then the upper page of WL1 (i.e., page 4) is programmed on both BL0 and BL1. The upper page of WL0 is then reprogrammed (i.e., RP) on both BL0 and BL1.

The order of programming then is page 0, page 1, page 2, page 3, page 4, reprogram page 2, page 5, page 6, reprogram page 4. This upper page reprogramming pattern is repeated for the entire memory block.

Figure 5:
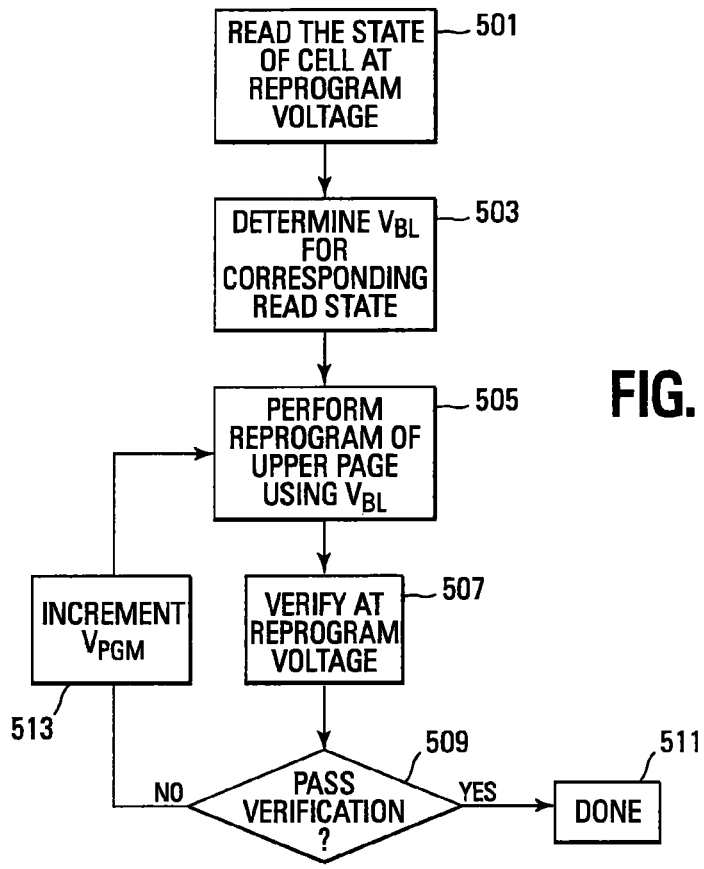
FIG. 5 shows a flowchart of one embodiment of a programming method of the present invention.
Figure 6:
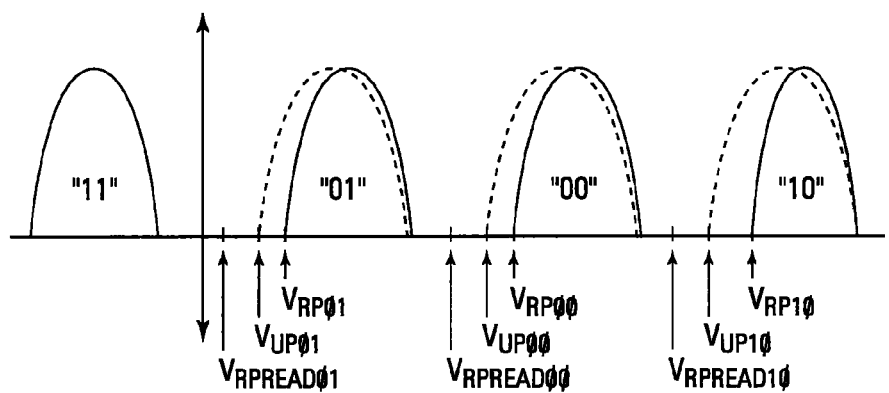
FIG. 6 shows a diagram of the voltages used in accordance with the programming method of FIG. 5.

FIG. 5 shows a flowchart of one embodiment of a method for programming a non-volatile memory device in accordance with the programming sequences of the present invention. FIG. 6 illustrates the threshold voltage distribution that corresponds to the embodiment of FIG. 5. The following discussion of the method of FIG. 5 refers to both the flowchart of FIG. 5 and the voltages of FIG. 6 and can use the programming sequences discussed in FIGS. 2 and 4.

The method reads the state of a cell 501 using one of the "reprogram" read voltages $V_{RP\ READ01}$, $V_{RP\ READ00}$, or $V_{RP\ READ10}$. These voltages are going to be lower than their respective upper page program voltages $V_{UP01}$, $V_{UP00}$, and $V_{UP10}$, respectively. The dotted lines for each $V_t$ distribution indicates the distribution for each state after the upper page has been programmed. The solid lines for each $V_t$ distribution indicates the desired distribution for each state after the upper page has been reprogrammed. The result of this read is the recognition of the data as a logical "01", "00", or "10".

Once the stored data is known, a bit line voltage ($V_{BL}$) is determined that corresponds with that data 503. In one embodiment, $V_{BL}$ is determined by the following:

"01" state: $V_{BL01} = V_{RP10} - V_{RP01}$

"00" state: $V_{BL00} = V_{RP10} - V_{RP00}$

"10" state: $V_{BL10} = 0V$ where $V_{RP10}$, $V_{RP01}$, and $V_{RP00}$ are the minimum desired threshold voltages for each of their respective states after the upper page has been reprogrammed.

In one embodiment, $V_{BL01}$ is approximately 2.5V, $V_{BL00}$ is approximately 1.25V. However, these voltages and the method to determine them are for purposes of illustration only as the present invention is not limited to any one method for determining $V_{BL}$ or any one $V_{BL}$ for any particular state.

The $V_{BL}$ is then used to perform the reprogramming of the upper pages 505 using a predetermined programming sequence. The sequences of FIG. 2 or 4 can be used as well as any other upper page reprogramming sequence.

A verification is then performed in response to the reprogramming of the upper page 507. The states are verified to the increased $V_t$ as illustrated in the solid lines of the distributions of FIG. 6.

If the verification operation passes 509, the programming operation is successfully completed 511. If the verification determines that the upper page has not been successfully reprogrammed, the programming voltage, $V_{pgm}$, is incremented to the next programming voltage 513 and the program/verify operations 505, 507 are repeated.

As an example, $V_{pgm}$ may start at 20V and the step voltage for incrementing $V_{pgm}$ may be 0.4V. However, the present invention is not limited to any one $V_{pgm}$ or $V_{pgm}$ step voltage.

In an alternate embodiment of the programming method of FIG. 5, only the logical state having the widest $V_t$ distribution is reprogrammed. In one embodiment, the widest state is the logical state "01" due to the erased state of "11". Reprogramming only the upper page of the widest state provides faster programming speed and a tighter distribution. Only the widest state is done in this embodiment because state "00" can typically already have a tighter threshold voltage distribution than state "01" and the last state, "10", is not required to have as tight a distribution as the other states.

In such an alternate embodiment, the method of FIG. 5 is the same except that if the state of the cell is determined 501 to be anything other than the widest state (i.e., logical "01"), the upper page reprogramming is not performed.

Another alternate embodiment would perform the upper page reprogramming operation only on the two widest distributions. For example, only the upper pages of logical states "01" and "00" would be reprogrammed in such an embodiment.

The upper page reprogramming embodiments of the present invention can be used to program non-volatile memory cells, blocks of non-volatile memory cells, or memory cell arrays. The present invention is not limited to any certain terminology used to describe a group of memory cells.

The embodiments of the present invention for programming are not limited to reprogramming the upper page only. FIGS. 9 and 10 illustrate embodiments in which the lower page of data is reprogrammed.

FIG. 9 illustrates yet another embodiment of the programming method of the present invention. This embodiment includes the programming sequence of page 0, page 1, page 2, page 3, page 4, page 5, page 6, page 7, reprogram page 1, reprogram page 3, page 8, page 9, page 10, page 11, reprogram page 5, reprogram page 7, page, 12, . . . . In this embodiment, the lower and upper pages of the even page of each word line is programmed first, then the lower and upper pages of the odd page is programmed. This sequence is repeated for the even/odd pages of WL0-31.

FIG. 9 shows that first the even page of WL0 is programmed (lower then upper pages), next the odd page of WL0 is programmed. The process continues with the even page of WL1 being programmed then the odd page of WL1 is programmed. Next the upper pages of WL0 are reprogrammed. This programming sequence continues as shown in FIG. 9.

FIG. 10 shows yet another programming sequence of the present invention. This embodiment is similar to the embodiment of FIG. 4 in that both even and odd pages of each word line are programmed as one. However, the programming sequence of this embodiment is to program page 0, page 1, page 2, page 3, reprogram page 1, page 4, page 5, reprogram page 3, page 6, page 7, reprogram page 5. This sequence continues for both even and odd pages of WL0-31.

FIG. 10 shows that the programming of the lower pages on WL0 is first performed. Then the upper pages of WL0 are programmed. Next the lower pages of WL1 are programmed followed by the upper pages of WL1. The upper pages of WL0 are then reprogrammed followed by the programming of the lower pages of WL2 and then the upper pages of WL2. The upper pages of WL1 are then reprogrammed. This sequence repeats for WL0-WL31.

Figure 11:
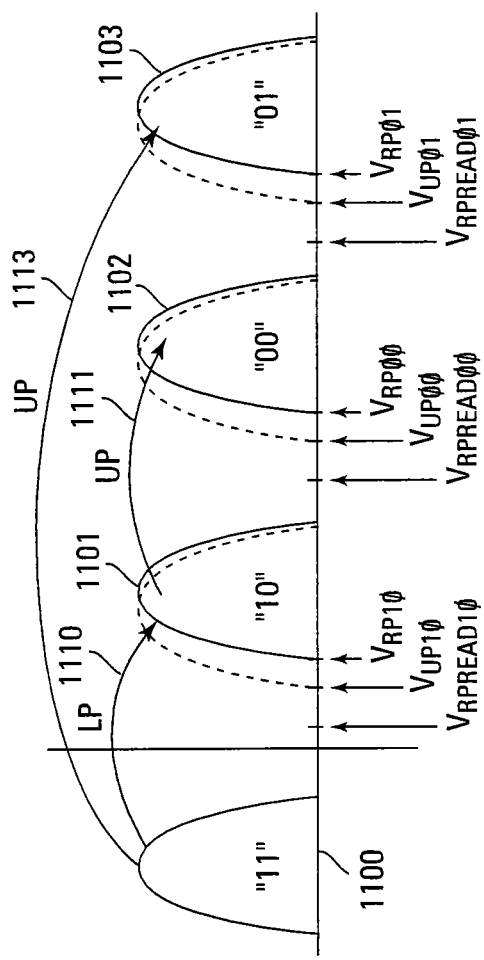
FIG. 11 shows a threshold voltage distribution in accordance with the non-volatile memory arrays of FIGS. 9 and 10.

FIG. 11 illustrates one embodiment of a threshold voltage distribution for the embodiments illustrated in FIGS. 9 and 10. This figure shows that the logical states 1100-1103 can have their threshold voltage distributions located at different voltages. In this embodiment, the logical "10" state 1101 is immediately after the erased state of "11" 1100. The logical state of "00" 1102 is next and the logical state of "01" 1103 is last.

In such an embodiment of FIG. 11, programming from the erased state 1100 to the logical "00" state is done with a lower page programming 1110 and an upper page programming 1111. Programming from the erased state 1100 to the logical "01" state uses an upper page programming 1113.

The above-described programming sequences are for purposes of illustration only. The present invention is not limited to any one programming/reprogramming sequence. For example, one embodiment may reprogram a particular cell after all surrounding cells of that particular cell have been programmed.

Figure 7:
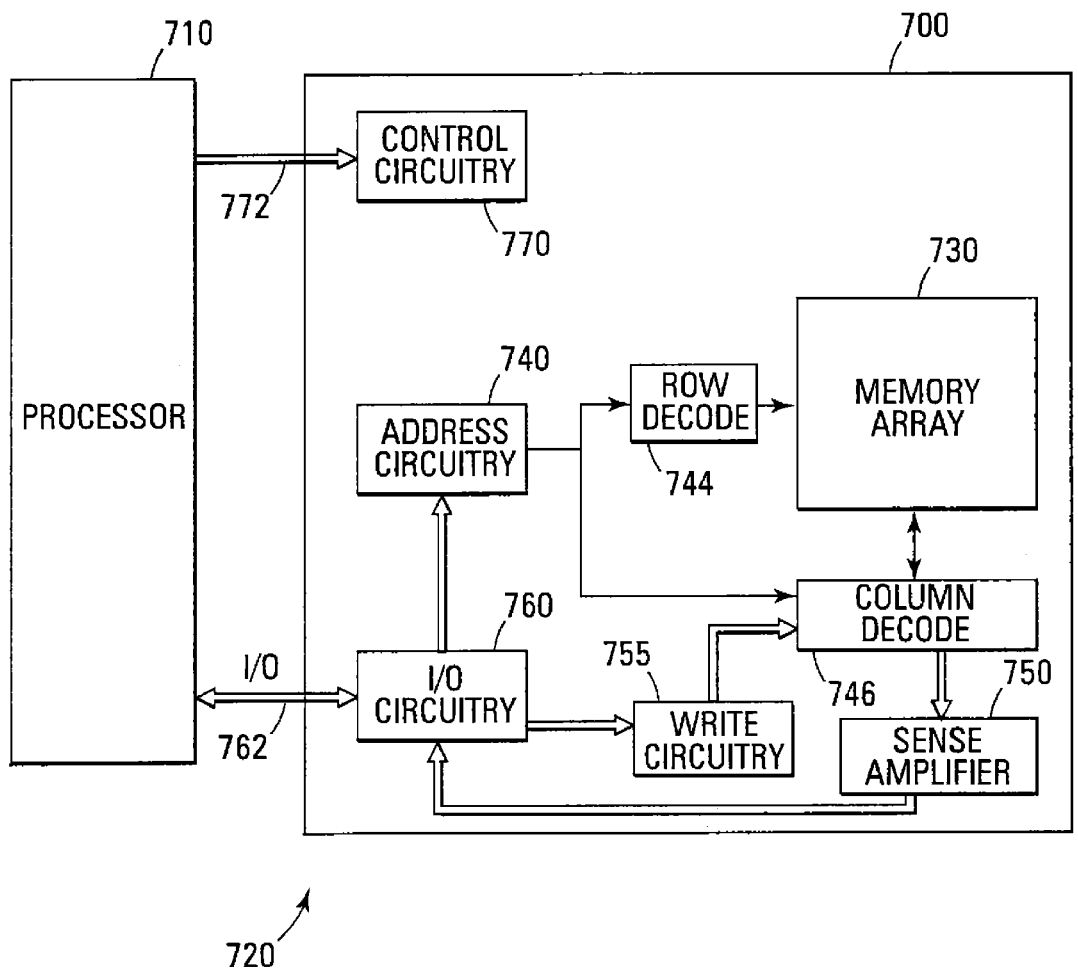
FIG. 7 shows a block diagram for one embodiment of a memory system of the present invention.

FIG. 7 illustrates a functional block diagram of a memory device 700 that can incorporate the embodiments for programming the non-volatile memory cells of the present invention. The memory device 700 is coupled to a processor 710. The processor 710 may be a microprocessor or some other type of controlling circuitry. The memory device 700 and the processor 710 form part of an electronic system 720. The memory device 700 has been simplified to focus on features of the memory that are helpful in understanding the present invention.

The memory device includes an array of flash memory cells 730 or some other type of non-volatile memory cells. The memory array 730 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture, a NOR architecture, an AND architecture, or some other array architecture.

An address buffer circuit 740 is provided to latch address signals provided over I/O connections 762 through the I/O circuitry 760. Address signals are received and decoded by row decoders 744 and column decoders 746 to access the memory array 730. It will be appreciated by those skilled in the art that, with the benefit of the present description, the number of address input connections and row/column decoders depends on the density and architecture of the memory array 730. That is, the number of addresses increases with both increased memory cell counts and increased bank and block counts.

The memory integrated circuit 700 reads data in the memory array 730 by sensing voltage or current changes in the memory array columns using sense/buffer circuitry 750. The sense/buffer circuitry, in one embodiment, is coupled to read and latch a row of data from the memory array 730. Data input and output buffer circuitry 760 is included for bi-directional data communication over the I/O connections 762 with the processor 710. Write circuitry 755 is provided to write data to the memory array.

Control circuitry 770 decodes signals provided on control connections 772 from the processor 710. These signals are used to control the operations on the memory array 730, including data read, data write, and erase operations. The control circuitry 770 may be a state machine, a sequencer, or some other type of controller. The control circuitry 770 of the present invention, in one embodiment, is responsible for executing the embodiments of the programming method of the present invention.

The flash memory device illustrated in FIG. 7 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 8:
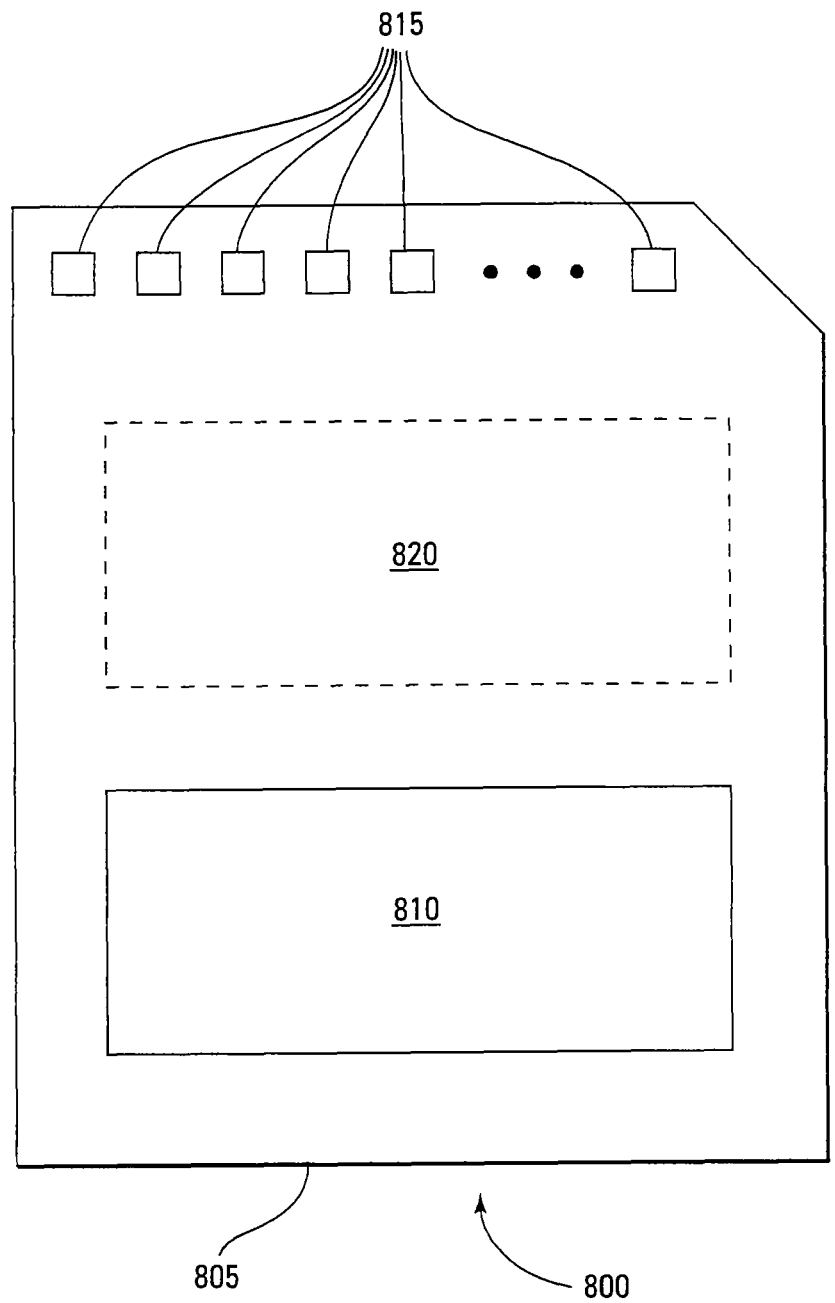
FIG. 8 shows a block diagram for one embodiment of a memory module of the present invention.

FIG. 8 is an illustration of a memory module 800 that incorporates the memory cell embodiments as discussed previously. Although memory module 800 is illustrated as a memory card, the concepts discussed with reference to memory module 800 are applicable to other types of removable or portable memory, e.g., USB flash drives. In addition, although one example form factor is depicted in FIG. 8, these concepts are applicable to other form factors as well.

Memory module 800 includes a housing 805 to enclose one or more memory devices 810 of the present invention. The housing 805 includes one or more contacts 815 for communication with a host device. Examples of host devices include digital cameras, digital recording and playback devices, PDAs, personal computers, memory card readers, interface hubs and the like. For some embodiment, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 815 provide an interface for passing control, address and/or data signals between the memory module 800 and a host having compatible receptors for the contacts 815.

The memory module 800 may optionally include additional circuitry 820. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of I/O connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810. The additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

In summary, the embodiments of the present invention provide tighter threshold voltage distributions by reprogramming one of either the upper page or lower page of the memory cells using predetermined programming sequences. This minimizes the floating gate-to-floating gate coupling effect between word lines. The $V_t$ shift experienced during the reprogramming can be substantially the same between each MLC state due to the determination and application of the different bit line voltages, determined in response to the read state. The quantity of programming pulses is also reduced.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A device comprising:
a plurality of memory cells, each cell adapted to store a lower page of data and an upper page of data; and
a controller circuit coupled to the plurality of memory cells, the controller circuit configured to program a memory cell of the plurality of memory cells such that first data is programmed in the lower page of the memory cell and second data is programmed in the upper page of the memory cell and the controller circuit is further configured to reprogram, with the second data, only the upper page of only a logical state having a widest threshold voltage distribution of the memory cell.

2. The device of claim 1 wherein the non-volatile memory device is a NAND flash memory device.

3. The device of claim 1 wherein the controller circuit is further adapted to read a state of a first programmed cell having a first verify voltage, generate a bit line voltage in response to the read state, bias the bit line coupled to the first programmed cell with the bit line voltage, and reprogram the upper page of the first programmed cell.

4. A system comprising:
a processor configured to generate memory signals; and
a memory device coupled to the processor and configured to operate in response to the memory signals, the device comprising:
a plurality of memory cells, each cell configured to store a lower page of data and an upper page of data; and a controller circuit coupled to the plurality of memory cells, the controller circuit configured to program a memory cell of the plurality of memory cells such that first data is programmed in the lower page of the memory cell and second data is programmed in the upper page of the memory cell and the controller circuit is further configured to reprogram, with the second data, only the upper page of only a logical state having a widest threshold voltage distribution of the memory cell.

5. The system of claim 4 wherein the memory signals comprise control signals, data signals, and address signals.

6. The system of claim 4 wherein the controller circuit is further configured to program the predetermined memory cells such that the lower pages of a pair of adjacent odd and even bit lines are programmed substantially simultaneously with a first data bit and the upper pages of the pair of adjacent odd and even bit lines are programmed substantially simultaneously with a second data bit.

7. A device comprising:
a plurality of memory cells; and
a controller circuit coupled to the plurality of memory cells and configured to:
program a first memory cell of the plurality of memory cells such that first data is programmed in a lower page of the first memory cell and second data is programmed in an upper page of the first memory cell;
program a second memory cell of the plurality of memory cells that is adjacent to the first memory cell; and
reprogram one of the first data or the second data into the first memory cell after the second memory cell is programmed wherein the controller is configured to reprogram the second data into the upper page only if the second data corresponds to a logical state having a widest threshold voltage distribution.

8. The device of claim 7, wherein the controller circuit being configured to reprogram one of the first data or the second data into the memory cell after the adjacent memory cell is programmed comprises the controller circuit being configured to reprogram the second data into the upper page of the memory cell.

9. The device of claim 8, wherein the controller circuit being configured to reprogram the second data into the upper page of the memory cell comprises the controller circuit being configured to reprogram only the upper page of the memory cell.

10. The device of claim 7, wherein the controller circuit being configured to reprogram one of the first data or the second data into the memory cell after the adjacent memory cell is programmed comprises the controller circuit being configured to:
read a state of the memory cell;
determine a bit line voltage in response to the read state; and
reprogram the second data into the upper page of the memory cell using the bit line voltage.

11. The device of claim 7, wherein the controller circuit being configured to reprogram one of the first data or the second data into the memory cell after the adjacent memory cell is programmed comprises the controller circuit being configured to reprogram the first data into the lower page of the memory cell.

12. The device of claim 11, wherein the controller circuit being configured to reprogram the first data into the lower page of the memory cell comprises the controller circuit being configured to reprogram only the lower page of the memory cell.

13. The device of claim 7, wherein the controller circuit is configured to program the first data in the lower page of the memory cell before programming a lower page of the adjacent memory cell, program the second data in the upper page of the memory cell before programming an upper page of the adjacent memory cell, and reprogram the second data into the memory cell after the lower and upper pages of the adjacent memory cell are programmed.

14. The device of claim 7, wherein the controller circuit is configured to program the first data in the lower page of the memory cell before programming the second data in the upper page of the memory cell, program a lower page of the adjacent memory cell before programming an upper page of the adjacent memory cell, and reprogram the second data into the memory cell after the lower and upper pages of the adjacent memory cell are programmed.

15. The device of claim 7, wherein the controller circuit comprises control circuitry of a memory device.

16. A device comprising:
a plurality of memory cells; and
a controller circuit coupled to the plurality of memory cells and configured to:
program a first memory cell of the plurality of memory cells such that first data is programmed in a lower page of the first memory cell and second data is programmed in an upper page of the first memory cell;
program a second memory cell of the plurality of memory cells that is adjacent to the first memory cell; and
reprogram one of the first data or the second data into the first memory cell after the second memory cell is programmed, the controller circuit being configured to reprogram the second data into the upper page of the memory cell only if the second data being reprogrammed into the upper page of the memory cell corresponds to one of the logical states having the two widest threshold voltage distributions.

* * * * *